(12) United States Patent    (10) Patent No.: US 12,372,101 B1
Chianghsieh et al.            (45) Date of Patent:    Jul. 29, 2025

(54) FAN MOUNTING SYSTEM

(71) Applicant: HEWLETT PACKARD ENTERPRISE DEVELOPMENT LP, Spring, TX (US)

(72) Inventors: Peng Chianghsieh, Taoyuan (TW); Chi-Ting Yang, New Taipei (TW); Yu-Shun Chang, Taipei (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 18/422,301

(22) Filed: Jan. 25, 2024

(51) Int. Cl.
*F04D 29/64* (2006.01)
*F04D 19/00* (2006.01)
*F04D 25/16* (2006.01)
*F04D 29/52* (2006.01)
*F04D 29/70* (2006.01)
*G06F 1/20* (2006.01)
*H05K 7/20* (2006.01)

(52) U.S. Cl.
CPC ......... *F04D 29/646* (2013.01); *F04D 19/002* (2013.01); *F04D 25/166* (2013.01); *F04D 29/522* (2013.01); *F04D 29/703* (2013.01); *G06F 1/20* (2013.01); *H05K 7/20736* (2013.01)

(58) Field of Classification Search
CPC .... F04D 29/646; F04D 19/002; F04D 25/166; F04D 29/522; F04D 29/703; G06F 1/20; H05K 7/20736
See application file for complete search history.

(56) References Cited

U.S. PATENT DOCUMENTS

| 6,330,156 | B1 | 12/2001 | Cresse |
| 6,826,456 | B1* | 11/2004 | Irving .................. G06F 1/20 |
| | | | 702/132 |
| 6,921,247 | B2 | 7/2005 | Stewart et al. |
| 7,558,061 | B2* | 7/2009 | Franz ................. F04D 29/646 |
| | | | 415/213.1 |
| 8,784,167 | B2 | 7/2014 | Youzhi |
| 2015/0351280 | A1* | 12/2015 | Gonzalez Inda ....... G06F 1/181 |
| | | | 415/126 |
| 2016/0146223 | A1* | 5/2016 | Cao .................... F04D 29/522 |
| | | | 165/122 |
| 2021/0161027 | A1* | 5/2021 | Inda .................. H05K 7/20172 |

FOREIGN PATENT DOCUMENTS

| EP | 3893616 A1 | 10/2021 |
| WO | 2020/181876 A1 | 9/2020 |

* cited by examiner

*Primary Examiner* — Aaron R Eastman
(74) *Attorney, Agent, or Firm* — Jones Robb PLLC

(57) ABSTRACT

An information processing system includes a printed circuit board assembly and a chassis to receive and support the printed circuit board assembly. The printed circuit board assembly includes a plurality of fan connectors. A bracket is configured to be coupled with the chassis. The system further includes a fan module, which comprises a fan rotor contained within a fan housing, an electrical connector, and a bracket connector to removably couple the fan module to the bracket. The fan module further includes an electrical connector couplable to a fan connector of the printed circuit board assembly.

16 Claims, 12 Drawing Sheets

US 12,372,101 B1

FAN MOUNTING SYSTEM

INTRODUCTION

Computers (e.g. servers) generate heat during operation. If the heat is not dissipated or cooling is not provided, damage can occur to various components within the system. Cooling systems come in a variety of forms, but all cooling systems help provide temperature control to allow the computer system, and the constituent components thereof, to continue functioning without damage.

BRIEF DESCRIPTION OF THE DRAWINGS

The present disclosure can be understood from the following detailed description, either alone or together with the accompanying drawings. The drawings and related description of the figures are included to provide a further understanding of the present disclosure and are incorporated in and constitute a part of this specification. The drawings illustrate one or more nonlimiting aspects and implementations of the present teachings and together with the description explain certain principles and operation. In the drawings.

DETAILED DESCRIPTION

Figure 1:
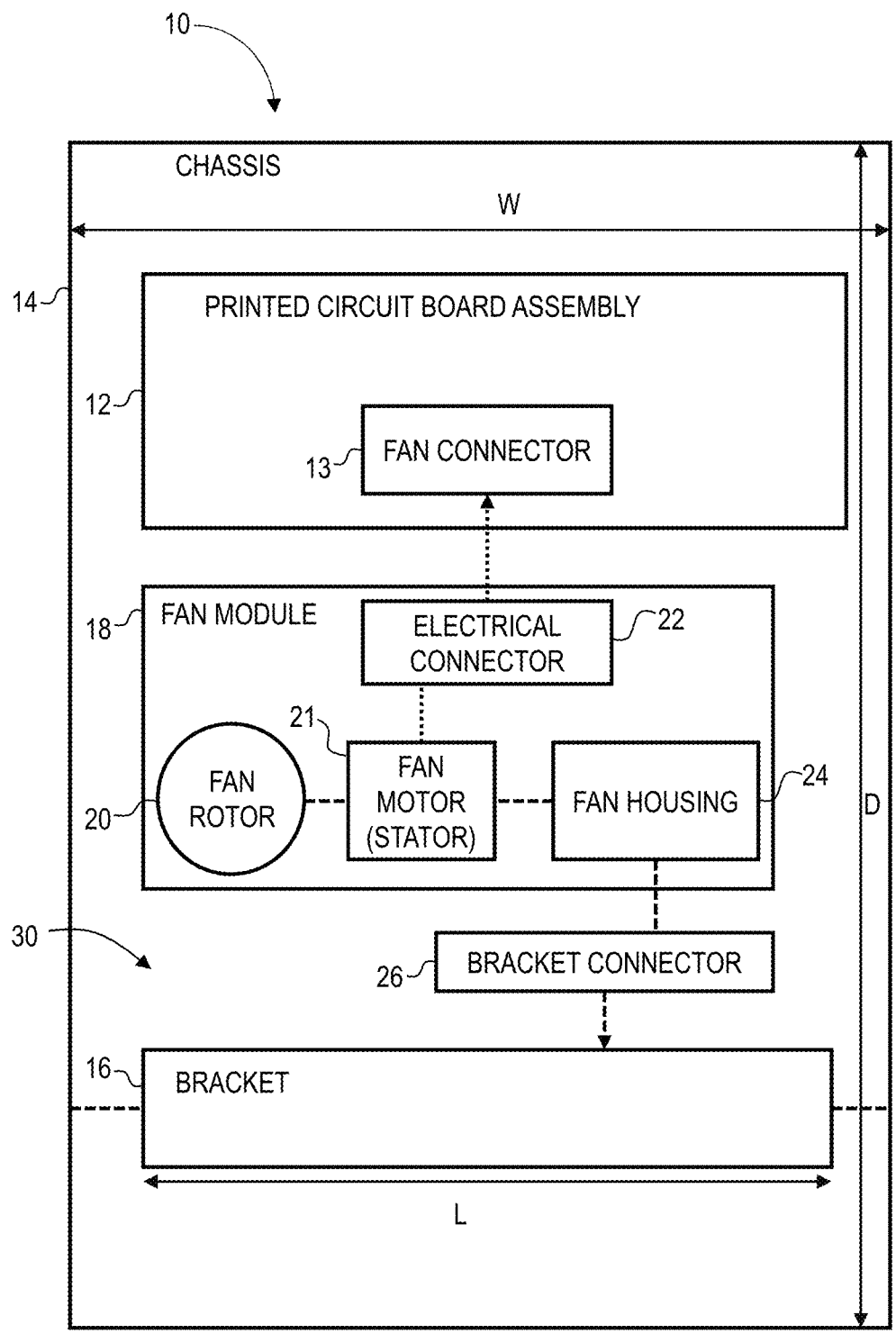
FIG. 1 is a diagram of a computing system comprising a fan mounting system consistent with the present disclosure.

Cooling systems are an important aspect of a computer, as without an adequate cooling system, the heat generated by the computer or server system may cause damage to components contained therein. Although multiple types of cooling systems for cooling a computer system exist, one way of cooling is installing fans within the system. The fans are electrically connected at fan connectors mounted at a predetermined position on a printed circuit board assembly, or PCA. Once installed, the fans can provide cooling for the system.

The fans are often installed in the system by attachment to a fan wall (or similar supporting structure), which is coupled to the chassis holding the PCA and related components. The fans can be mounted to the fan wall (or other supporting structure) at a finite number of predetermined fan mounting locations distributed along a length dimension of the fan wall (which corresponds to a width dimension of the chassis). For example, the fan wall may include attachment features (e.g., screw holes) for attaching the fans to the fan wall and/or airflow control features (e.g., cutouts) to control airflow through the fans. The locations of these attachment features and/or airflow control features may determine the possible fan mounting locations on the fan wall.

Different computer systems may need their fans to be arranged in different positions, for example, because their heat generating components may be located in different positions and/or because different PCAs may have their fan connection points at different locations. As a result, different fan walls may need to be used for different computer systems, with each fan wall having an arrangement of fan mounting locations that matches the needs of the particular computing system that the fan wall is designed to work with.

This means that a manufacturer that manufactures multiple different types of computer systems or platforms may also need to design and manufacture (or procure) multiple different types of fan walls, which can increase the overall costs of the computer systems. For example, designing multiple different types of fan walls may require additional engineering time, which increases development costs. Moreover, the different types of fan walls may require different tooling to manufacture, which may increase manufacturing costs of the fan walls themselves. Furthermore, the different fan walls may need to have different Stock-Keeping-Units (SKUs), which can increase logistical complexity and costs.

To address these issues, disclosed herein are fan mounting systems that allow for securing fans to the chassis of a computing device in a manner that allows the locations of the fans to not be limited to a finite set of predetermined fan mounting locations. Instead, the present fan mounting systems allow for fans to be installed nearly anywhere along the width dimension of the chassis (e.g., at any position of an infinite set of positions along the width dimension). As a result, each of the fan mounting systems of the present disclosure is able to accommodate multiple different positional arrangements of fans. This means that a given fan mounting system disclosed herein may be used with multiple different computing systems which have different needs for fan positioning. The ability to use a single fan mounting system across multiple different computing systems can reduce development, manufacturing, and logistical costs as compared to providing different fan walls for different computing systems.

The fan mounting systems of the present disclosure each comprise a universal bracket that couples to a chassis of the computing system and connectors that removably connect the fans to the universal bracket. The connectors are attached to (or configured to be attached to) fan housings of the fan. Each connector is configured to removably couple the fan to the bracket. The connectors can be connected to the universal bracket at any of an infinite set of positions—in some examples, anywhere along the length of the universal bracket that is not already occupied by something else or otherwise excluded. Thus, the bracket does not have a finite set of predetermined mounting positions; instead, the fans can be positioned at any location corresponding to a desired fan installation location (e.g., corresponding to a fan connection point of a PCA). In addition, in some examples, fan mounting systems of the present disclosure includes fan partitions to allow fans to be separated from other components (such as cables). The fan partitions also have removable connections to attach to the bracket, which allow the partitions to be located at any of an infinite set of positions along the bracket.

FIG. 1 is an example diagram of a fan mounting system 30 and a computing system 10 consistent with the present disclosure. It should be understood that FIG. 1 is not intended to illustrate specific shapes, dimensions, or other structural details accurately or to scale, and that implementations of the fan mounting system 30 and computing system 10 may have different numbers and arrangements of the illustrated components and may also include other parts that are not illustrated. In FIG. 1, physical connections (e.g., physical attachment and/or support) are indicated conceptually by dashed lines, whereas electrical connections are indicated conceptually by dotted lines. The fan mounting system 30 is illustrated in FIG. 1 in the context of the computing system 10 to aid understanding, but the fan mounting system 30 can be provided separately from the computing system 10. In other words, some examples comprise the fan mounting system 30 alone and other examples comprise the computing system 10 with the fan mounting system 30 installed therein.

System 10 includes a chassis 14, a printed circuit board assembly, or PCA, 12 housed in and/or supported by the chassis 14, one or more fan modules 18 (only one is illustrated in FIG. 1) electrically connected to the PCA 12, and a fan mounting system 30 attached to the chassis 14 and connected to the fan modules 18. These components will be described in greater detail in turn below.

The PCA 12 comprises a printed circuit board (PCB) and one or more electronic components mounted to the PCA 12. For example, the PCA 12 may be a primary system board (e.g., a motherboard) that comprises a processor and other electronic circuitry (not illustrated), but examples are not so limited and any PCA may be used. The PCA 12 includes one or more fan connectors 13 mounted to the PCB. In some examples, the PCA 12 may be a plurality of fan connectors 13 mounted to the PCB of the PCA 12. For example, FIGS. 2-6, 8, and 10 illustrate various example systems, which are described in greater detail below, in which a plurality of fan connectors are mounted to the PCB of the PCA. A fan connector 13 refers to an electrical connector configured to receive (e.g., physically mate with) and electrically connect with a complimentary electrical connector of a fan (e.g., the electrical connector 22 of fan module 18, described in further detail below). Each fan connector 13 may include a connector body (e.g., a receptacle) and electrical components (e.g., pins, spring fingers, electrical contact pads, etc.) coupled thereto and arranged to establish electrical connections to the electrical connector of the fan such that electrical power and data signals can be communicated between the PCA 12 and the fan. In addition, in some examples, the fan connectors 13 may also provide some physical support to the fan module 18 to assist in securing and/or stabilizing the fan module 18. In some examples, the physical coupling between the fan connectors 13 and the electrical connectors 22 may be a friction fit, a snap fit, an interference fit, or any other form of coupling that allows the external fan to be held securely by the fan connector.

As noted above, computing system 10 may further include a fan mounting system 30 to mount the fan modules 18 to the chassis 14. The fan mounting system 30 comprises a bracket 16, which may be coupled with the chassis 14, and a bracket connector 26, which may be coupled to the fan module 18. In some examples, the bracket 16 may be coupled with the chassis 14 by mechanical fasteners (for example, screws), while in other examples, the bracket 16 may be coupled to the chassis 14 by any other desired fastening technique, such as a friction or interference fit to a portion of the chassis 14, adhesive, welding, or any other suitable fastener. The bracket 16 may have a length L and may be coupled with the chassis 14 such that length L extends along a width dimension W of the chassis 14. The length L corresponds to a longest dimension of the bracket 16. The width dimension W of the chassis 14 may extend transvers (e.g., perpendicular) to a front/back dimension D of the chassis 14, which extends between a front panel and a rear panel of the chassis 14. The front and rear panels (not illustrated) may comprise perforations through which air enters and exits the system, such that in some examples airflow through the chassis 14 extends generally along the front/back dimension D from the front panel to the rear panel and vice versa. In other words, in some examples, the length L and width dimension W are transverse (e.g., perpendicular) to the direction of airflow through the chassis 14. In some examples, the front and rear panel may comprise components (or bays configured to hold such components) designed to be accessible during usage, such as electrical ports/connectors and removable modules (e.g., hot pluggable storage drives).

Figure 5:
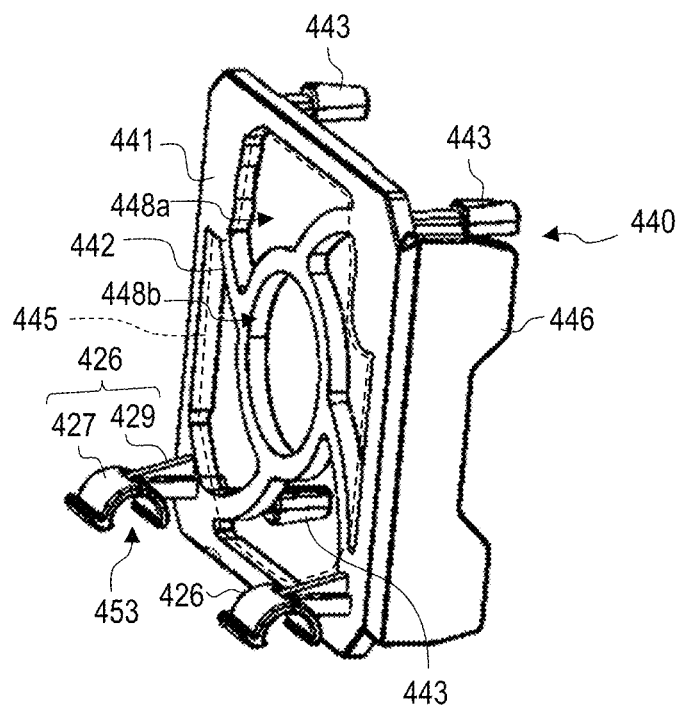
FIG. 5 is a perspective view of fan grating comprising a bracket connector of the fan mounting system of FIG. 4.
Figure 6:
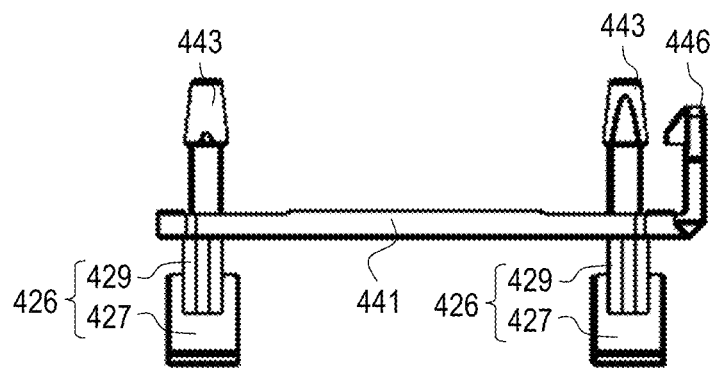
FIG. 6 is a top view of the fan grating of FIG. 5.

In addition to being connected to the PCA 12, the fan module 18 may be coupled to bracket 16 via a bracket connector 26. Although FIG. 1 shows one bracket connector 26, examples are not so limited and more than one bracket connector may be used. For example, FIGS. 5-6 and FIG. 8 illustrate examples in which two bracket connectors are provided per fan module. In other examples more than two bracket connectors can be provided per fan module.

The bracket connector 26 may be configured to connect to the bracket 16 via a removable or repositionable connection. For example, bracket connector 26 may be a snap fit connector (see FIGS. 8A and 8B, which illustrate one example, described in greater detail below, in which a bracket connector is a snap fit connector). A snap fit connector comprises flexible engagement members configured to interlock with complementary engagement members of another part. During mating of a snap fit connector with the other part, the flexible engagement members are initially pushed away from their resting state by contact with the other part until a predetermined position is reached, whereupon the spring forces generated from the flexing of the flexible engagement members snaps them back towards their resting positions. The result is the flexible engagement members interlocking with the complementary engagement members of the other part to attach the snap fit connector to the other part.

In some examples, the bracket 16 comprises a base portion and a rail portion which is coupled to the base portion and extends parallel to the length L. The bracket connector 26 may attach to the rail. In some examples, the rail may comprise a latching feature which engages (e.g. interlocks) with a latching feature of the bracket connector 26 to connect the bracket connector 26 to the rail. In some examples, the latching feature of the rail may extend continuously along a given length of the rail such that the bracket connector 26 can be connected to the rail at any position along that given length, as opposed to being connectable at a finite set of positions along the length. In some examples, the rail is integrally formed with the base portion (i.e., they are part of the same unitary or monolithic body)—for example, the rail portion may be formed by bending or rolling an edge of the base portion. In other examples, the rail is initially formed separately from the base portion and is later attached thereto (e.g., by mechanical fasteners, adhesives, welding, etc.).

Figure 8A:
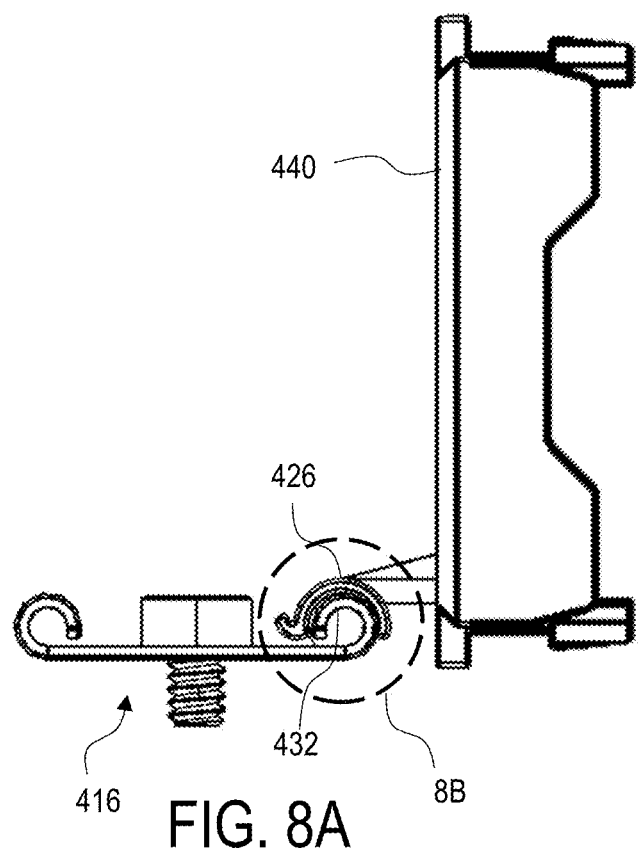
FIG. 8A is side view of the fan mounting system of FIG. 4 in a state of the bracket connector attached to the bracket.
Figure 8B:
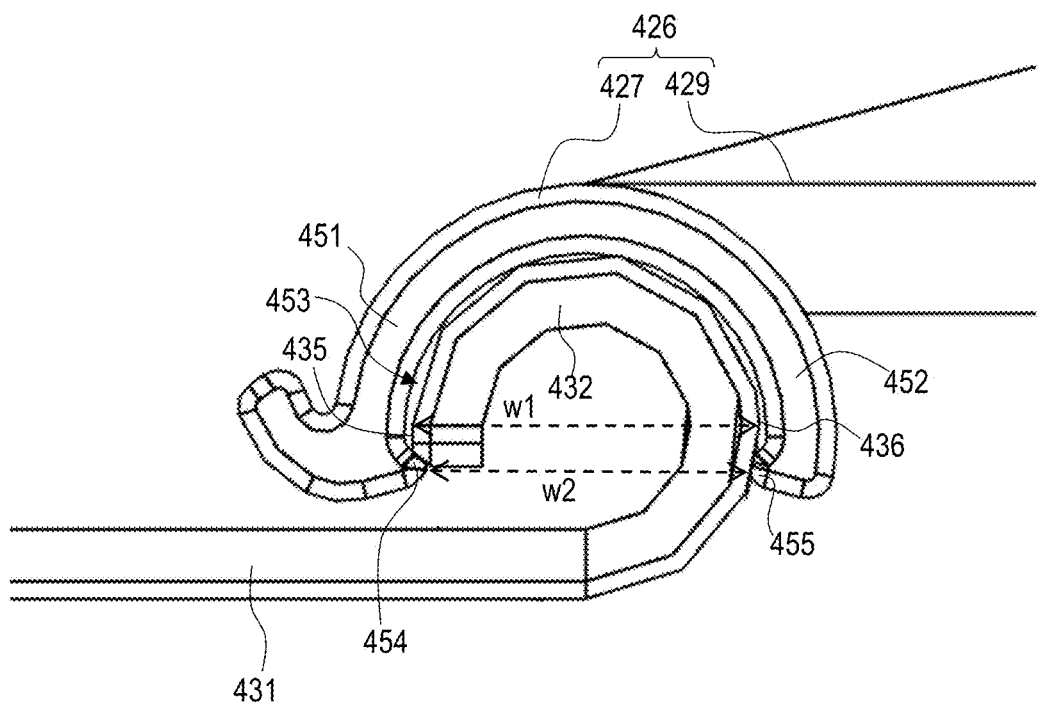
FIG. 8B is an enlarged view of the region 8B in FIG. 8A showing the bracket connector engaged with the bracket.

In some examples in which the bracket connector 26 comprises a snap fit connector, the bracket connector 26 may have an arch-like shape, with a central portion and two curved segments extending in opposite directions from the central portion to define a channel therebetween, with the channel having a curved (e.g., semi-circular) profile. In these examples, the rail portion of the bracket 16 may have a curved shape which is complementary to that of the bracket connector 26 such that the rail portion of the bracket 16 can be received within the channel defined by the bracket connector 26. The curved segments form the flexible engagement members of the snap fit connector, and flange or other latching feature is provided at one end of one of the curved segments of the bracket connector. As the bracket connector 26 is pushed onto the bracket 16, the curved surfaces of the rail cause the curved segments to flex outward until the flange or other latching feature thereof passes a complementary latching feature of the rail, whereupon the flange or other latching feature snaps into engagement with the complementary latching feature of the rail. For example, in some examples, the bracket 16 may include a rolled edge having a complementary profile to the bracket connector 26. For example, FIGS. 8A-8B illustrate one example system, described in greater detail below, in which the rail of the bracket comprises a rolled edge. Bracket connector 26 may also couple to bracket 16 via an interference fit, by a repositionable adhesive, or by a physical coupling, such as a screw.

In some examples, the fan module 18 comprises a lower portion and an upper portion arranged opposite one another, with the lower portion being located closer than the upper portion to the PCA 12 when the fan module 18 is installed, and in some examples, the bracket connector 26, when connected to the fan module 18, may be located on the lower portion of the fan housing 24. In some examples, the bracket connector 26 may be attached directly to the fan housing 24. In some examples, the bracket connector 26 may be integrally formed with the fan housing 24, i.e., the bracket connector may be manufactured as a part of the fan housing 24. In other examples, the bracket connector 26 may be manufactured separately from the fan housing 24 and may be attached directly to the fan housing 24 by, for example, adhesive, screws, or any other suitable fastening means. In still other examples, the bracket connector 26 may be removably couplable to the fan housing 24 by, for example, snapping onto the fan housing 24 when the fan module 18 is ready to be used. In other examples, the bracket connector 26 may be attached indirectly to the fan housing 24. For instance, in some examples, the bracket connector 26 may be attached to or integrally formed with another part (e.g., a fan grating or a finger/blade guard) which is in turn attached to the fan housing 24.

The fan module 18 may be coupled to the bracket 16 at any location out of an infinite set of connection locations along the length L of the bracket. Note that the infinite set of connection locations does not necessarily include all possible locations along the length L, as some locations may be blocked or otherwise excluded. For example, locations physically blocked by other elements may be excluded from the set. As another example, the rail or other portions of bracket 16 to which the connectors 26 attach may not extend across the full length L of the bracket or may contain multiple segments separated by gaps, and positions in such gaps may be excluded from the infinite set of positions. However, each of the segments of the bracket 16 to which connection is possible defines a range of positions continuously varying along the length direction and having an infinite set of connection locations.

In some examples, although the fan mounting system 30 allows for infinite variation in the location of the fans along the length dimension L, the fan modules 18 may nevertheless be limited by other factors when it comes to their installation location. For example, in some implementations, the main limitation on the locations for the fan module(s) 18 is the location of the fan connector(s) 13 on the PCA 12. As described previously, a PCA 12 includes a plurality of fan connectors 13, which may be distributed generally along the width W of the PCA 12 (e.g., arranged along a line parallel to the width W of the PCA). Since the fan module 18 is to couple to a fan connector 13, the locations of the fan modules 18 may be limited by the locations of the fan connectors 13. In particular, in some examples, the position of the electrical connectors 22 is fixed relative to the fan housing 24 (e.g., because the electrical connectors 22 are rigidly connected to the fan housing 24) and in such examples the acceptable installation locations along length L for fan modules 18 are determined by the locations of fan connectors 13 (e.g., each fan module 18 is to be installed at a location at which its connector 22 is aligned with a corresponding fan connector 13). However, in such cases, the installation locations of the fan modules 18 are not limited by the fan mounting system 30 but rather by the arrangement of connectors 22, and the bracket 16 may receive the fan modules 18 at any location along its length L, provided that another piece of hardware (e.g., another fan module or an attachment piece) is not already present at that location. In addition, bracket 16 may be installed at a second chassis. The second chassis may be supporting a second PCA with differently located fan connectors than the fan connectors of PCA 12; however, bracket 16 may still receive the fan module 18 at any location along the length L of bracket 16. In this manner, different positional arrangements of fan connectors 13 (such as may occur between different models of computing systems or different configurations of the same model) do not necessitate different fan attachment structures, as the same fan mounting system 30 can be used in these systems regardless of the differences in fan connector 13 positions.

Figure 2:
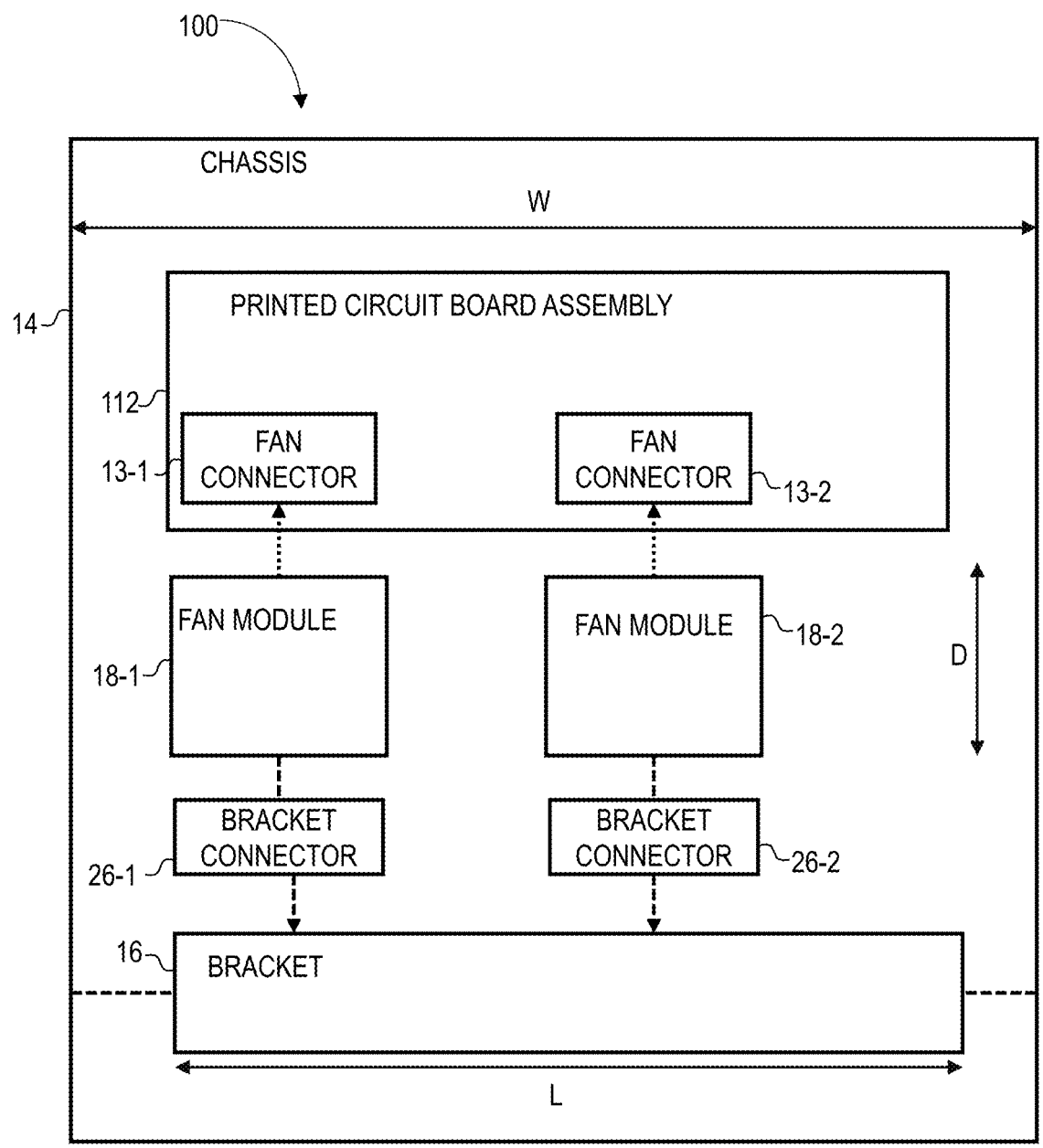
FIG. 2 is another diagram of a computing system comprising a fan mounting system consistent with the present disclosure.

As noted above, the computing system 10 can have multiple fan connectors 13 and multiple fan modules 18. For example, FIG. 2 illustrates one such configuration example of the computing system 10, in the form of computing system 100. Like the system 10 shown in FIG. 1, in system 100 a single bracket 16 is in use, and the bracket 16 is coupled to the chassis 14. The system 100 also includes a PCA 112 that is received at the chassis 14. This PCA 112 is a configuration example of the PCA 12 in which multiple instances of the fan connector 13 are present, including at least fan connector 13-1 and 13-2 as illustrated in FIG. 2. Similar to the system 10 shown in FIG. 1, system 100 includes fan modules 18. In the case of system 100, multiple fan modules 18 are present, including a first fan module 18-1 and a second fan module 18-2. The first fan module 18-1 and the second fan module 18-2 each comprise components similar to those illustrated with respect to fan module 18 in FIG. 1, which are omitted from FIG. 2 for clarity. The first fan module 18-1 is electrically connected to the first fan connector 13-1, while the second fan module 18-2 is electrically connected to the second fan connector 13-2. Moreover, the first and second fan modules 18-1 and 18-2 are coupled to the bracket 16 by bracket connectors 26-1 and 26-2, respectively, which are two instances of the bracket connector 26 described above. In this example system 100, the installation locations of the fan modules 18 are limited by the locations of the fan connectors 13, and thus, the first fan module 18-1 may be coupled with the bracket 16 at a first location corresponding to the first fan connector 13-1 and the second fan module 18-2 may be coupled with the bracket 16 at a second location corresponding to the second fan connector 13-2.

Notably, in some examples, neither the first fan module 18-2 nor the second fan module 18-2 are limited to being coupled to the first fan connector 13-2 and the second fan connector 13-2, respectively. Rather, and as previously discussed, in some examples, the PCA 12 or 112 may include more than two fan connectors 13 distributed along the width W of the PCA 12 or 112, such that each fan connector has a different and distinct location. Thus, in some examples, the first fan module 18-1 and the second fan module 18-2 are movable between the plurality of fan connectors 13 and can be installed at any location along the length L of the bracket 16 where there is a corresponding fan connector 13 and where there is not another fan module, fan partition, or other restriction. Moreover, different implementations of the PCA 12 or 112 can have different numbers and locations for their various fan connectors 13, and thus the locations at which the fan modules 18 are installed can vary from one implementation to the next. Furthermore, in some examples, because the bracket connectors 26 can couple to the bracket 16 at an infinite set of locations rather than a predetermined, finite set of locations, a given implementation of the bracket 16 could be used with multiple different implementations of the PCA 12 or 112 having different numbers and/or locations of fan connectors 13.

Figure 3:
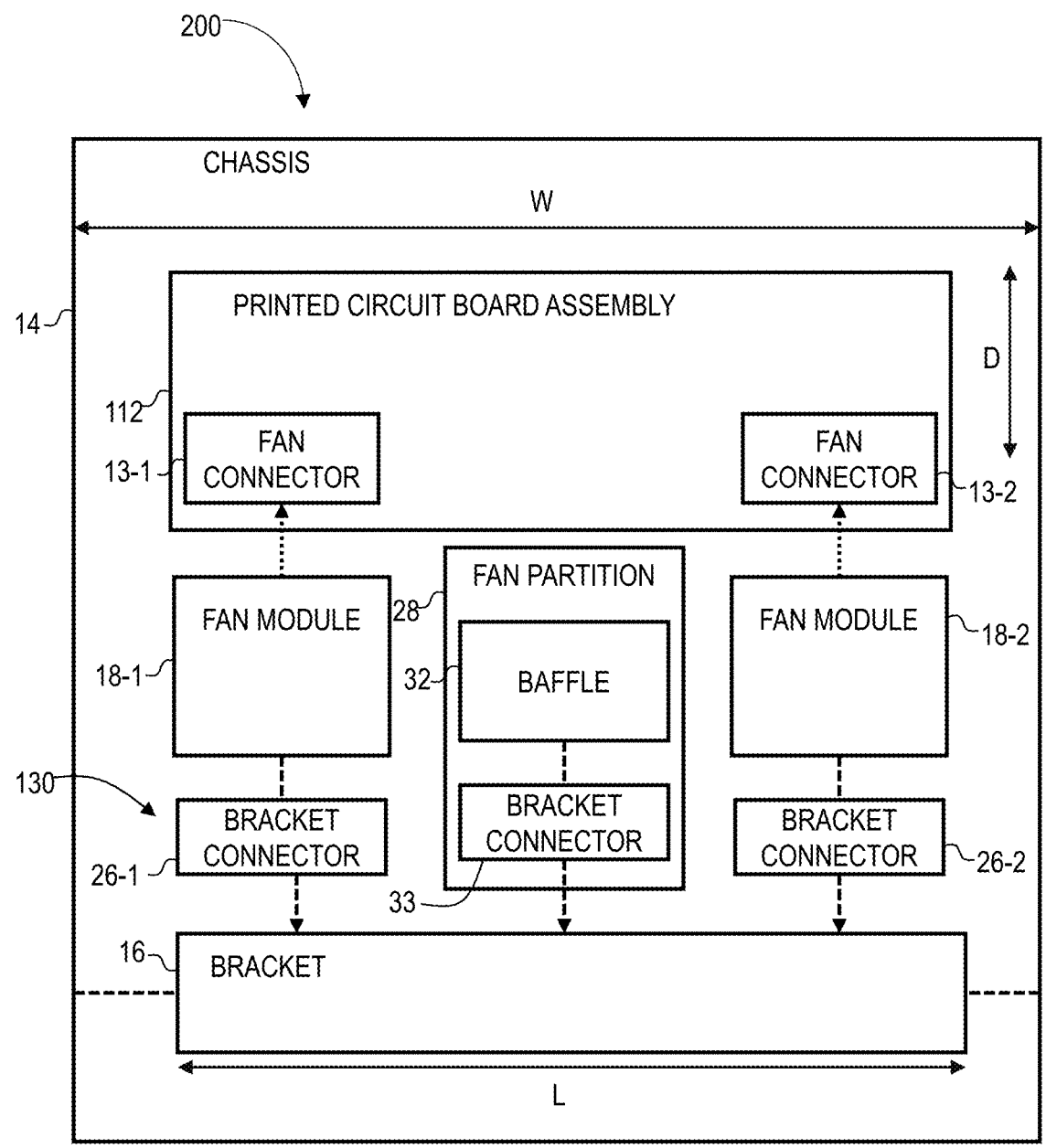
FIG. 3 is a diagram of a computing system comprising a fan mounting system consistent with the present disclosure.

In addition, in some examples, the fan mounting system and/or the computing system 10 may include at least one fan partition. For example, FIG. 3 illustrates an example fan mounting system 130 comprising fan partitions 28, with the fan mounting system 130 being one configuration example of the fan mounting system 30. As an example of the fan mounting system 130, the fan mounting system 130 comprises the bracket 16 and the bracket connectors 26, which have been described previously. In addition, the fan mounting system 130 comprises one or more fan partitions 28 (although only one is shown in FIG. 3, multiple fan partitions could be included in some examples). FIG. 3 illustrates the example fan mounting system 130 installed in a computing system 200, which is a configuration example of the computing system 100 described above with respect to FIG. 2 with the addition of the fan partitions 28.

The fan partition 28 may include a connector 33 to removably couple the fan partition 28 to the bracket 16. The connector 33 may be a snap fit connector similar to bracket connector 26 or may be any other type of removable connector. A baffle 32 may be connected to, and extend from, the connector 33. In some examples, the baffle 32 may have a generally sheet or plate like shape which is relatively thin in one dimension and relatively broad in two other dimensions perpendicular to the thin dimension. In some examples, when the partition 28 is installed in the chassis 13 and connected to the bracket 16, the relatively broad dimensions of the baffle 32 may include a first dimension which extends upwardly from the connector 33 and a second dimension which extends parallel to direction D (upwardly refers to a direction perpendicular to the width dimension W and the front/back direction D). The baffle 32 may be substantially solid; however, in other examples, baffle 32 may also contain perforations or cutouts.

In some examples, fan partition 28 may be installed adjacent to a fan module 18. When multiple fan modules 18 are in use, in some instances, a fan partition 28 (or multiple fan partitions 28) may be positioned between adjacent fan modules 18, such as between a first fan module 18-1 and a second fan module 18-2, as shown in FIG. 3. In such examples, the baffle 32 of the fan partition 28 separates the first fan module 18-1 and the second fan module 18-2. In some examples, multiple fan partitions 28 may be positioned between two adjacent fan modules 18 for example, to form a corridor between the fan partitions 28 through which cables or other components can be routed. In such examples, the fan partitions 28 may protect the fan modules 18 from the cables or other components routed through the channel so that the cables or other components do not push against or contact the fan modules 18, which could cause damage.

Turning now to FIGS. 4-14, a fan mounting system 430 and a computing system 410 will be described. The fan mounting system 430 is an example configuration of the fan mounting system 30 described above. The computing system 410 is an example configuration of the computing system 10 described above. Accordingly, some components of the system 430 and 410 correspond to (i.e., are configuration examples of) components of the systems 30 and 10 described above. These corresponding components are given reference numbers having the same last two digits (e.g., 26 and 426). Although systems 430 and 410 are example configurations of the systems 30 and 10, respectively, the systems 30 and 10 are not limited to systems 430 and 410.

Figure 4:
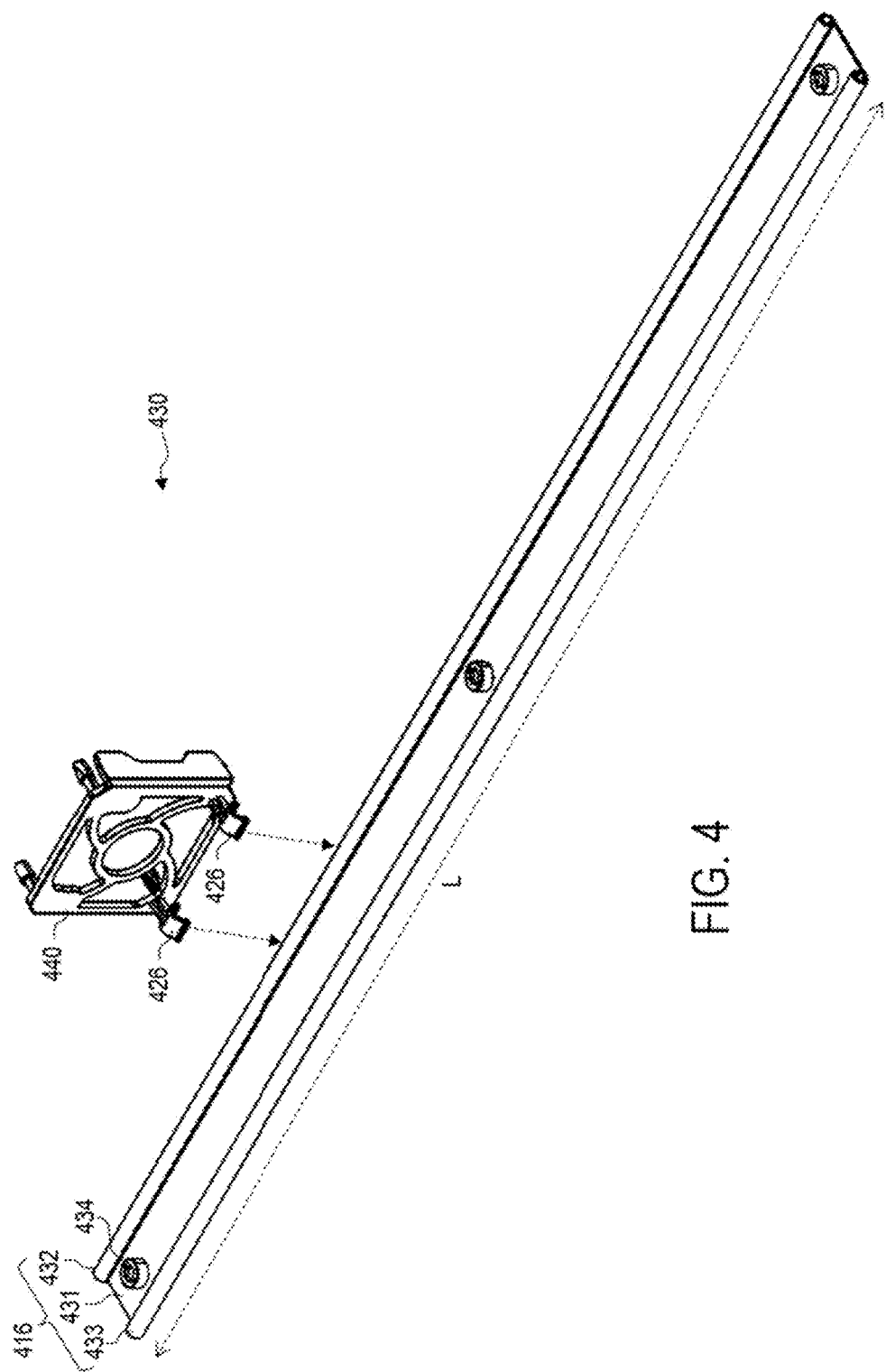
FIG. 4 is a perspective view of a fan mounting system consistent with the present disclosure.

FIG. 4 illustrates fan mounting system 430 in a state not yet installed in the computing system 410. The fan mounting system 430 comprises a universal bracket 416 and one or more bracket connectors 426. The universal bracket 416 is an example configuration of the bracket 16, and comprises a base portion 431 and two rails 431 and 433 extending along length L. The rails 432 and 433 are configured to receive the bracket connectors 426. In this example, the rails 432 and 433 are integrally coupled to the base portion 431 and comprise rolled edges thereof. In this example, the rails 432 and 433 extend continuously along the length of the bracket 416 such that the bracket connectors 426 can be connected thereto at any position along the length. In other examples, the rails 432 and/or 433 may be broken into segments separated by gaps. In this examples, mechanical fasteners 434 are provided to attach bracket 416 to the chassis of a computing system such as chassis 414 of computing system 410, described below.

As shown in FIGS. 2-4, in this example, the bracket connectors 426 are integrally coupled to (i.e., formed as part of the same unitary/monolithic body as) a fan grating 440. The fan grating 440 is configured to be coupled to a housing 424 of a fan module 418. As shown in FIG. 5, the fan gratin grating 440 comprises a frame 441 defining and encircling an opening 445 and protective member 442 coupled to the frame 441 and extending across the opening 445 to divide the opening 445 into many smaller openings 448 (e.g., openings 448a and 448b are labeled in FIG. 5). The protective members 442 are configured to block objects, such as fingers or cables, from being inserted through the opening 445 and colliding with the fan blades on the other side while still allowing airflow through the opening 445 (via the smaller openings 448). The fan grating 440 may also comprise attachment elements 443 and 446 to engage with a fan housing 418 and attach the fan grating 440 thereto.

As shown in FIGS. 3-8B, in this example, the bracket connectors 426 comprise snap fit connectors comprising an engagement portion 427 and an attached portion 429. The attached portion 429 of each bracket connector 426 is attached to the frame 441. Specifically, in the examples illustrated in FIGS. 4-14, there are two bracket connectors 426 per fan grating 440 and the attached portions 429 thereof are arranged at opposite lower lateral corners of the frame 441.

Figure 7:
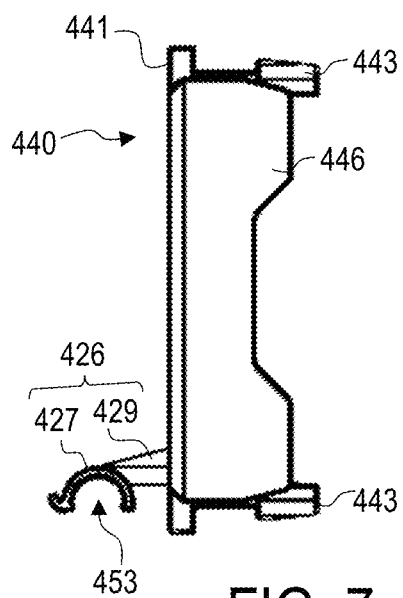
FIG. 7 is a side view of the fan grating comprising a bracket connector of the fan mounting system of FIG. 4.

In addition, as shown in FIGS. 5 and 7, the engagement portions 427 define channel 453 having a curved (e.g., semi-circular) profile, which is configured to receive the rolled edge of rail 432, as shown in FIGS. 8A and 8B. More specifically, the engagement portions 427 have an arch-like shape, with a central portion and two curved segments 451 and 452 extending in opposite directions from the central portion to define the channel 453 therebetween, with the channel having a curved (e.g., semi-circular) profile. The rail portion 432 has a complementary curved shape such that the rail portion 432 can be received within the channel 453. The curved segments 451 and 452 form the flexible engagement members of the snap fit connectors 426. The curved segments 451 and 452 may also comprise latching features 454 and 455 at the ends thereof, which may comprise protrusions/ridges. These latching features 455 and 455 may engage with complementary latching features 435 and 436 of the rail portion 432, as shown in FIG. 8B. The latching features 435 and 436 may be formed by portions of the rail 432 which are separated by a first width w1, and which are adjacent to portions of the rail 432 separated by a second width w2, which is smaller than the first width w1. In other words, the latching features 435 and 436 comprise portions of the rail 431 that protrude laterally outward farther than adjacent portions of the rail 432.

Moreover, the first width w1 is wider than a separation distance of the latching features 454 and 455 in their resting state. Thus, as the connector 426 is pushed onto the rail 432, the curved segments 451 and 452 will be pushed upon by the rail 432 and flex outward until the latching features 454 and 455 pass by the portion of the rail 432 having the width w1. At this point, the latching features 454 and 455 are now adjacent to the portion of the rail 432 having the width w2, and thus the curved segments 451 and 452 can snap back towards their resting separation. This results in the latching features 454 and 455 being positioned below the latching features 435 and 436, and the latching features 435 and 436 now abut the top sides of the latching features 454 ad 455 and thereby resist upward movement of the connector 426. In this manner, the connector 436 is snap-fit connected to the bracket 416. The connector 426 can be removed from the bracket 416 by causing the curved segments 451 and 452 to flex outward, thereby allowing the attachment features 454 and 455 to move upward past the attachment features 435 and 436. In this example, the latching features 435 and 436 are formed by edges or portions of the rail 432 which extend continuously along the entire length L of the bracket 416, and therefore the snap-fit connectors 426 can connect to the bracket 416 at any position (out of a set of infinite positions) along that length L.

Figure 9:
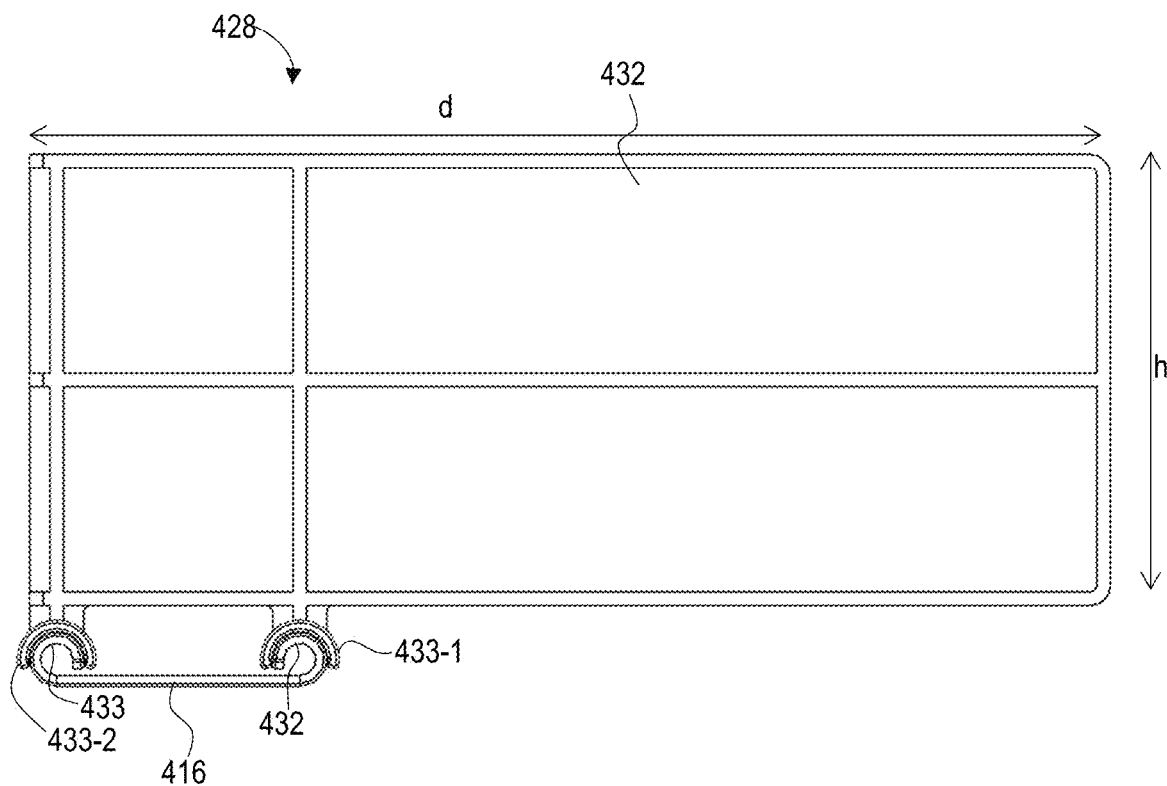
FIG. 9 is a side view of the fan mounting system of FIG. 4 showing a fan partition in an attached state to the bracket.

In some examples, fan mounting system 430 further comprises one or more partitions 428. For example, FIG. 9 illustrates one fan partition 428 in an attached state to the bracket 416. The fan partition may include two connectors 433-1 and 433-2 to removably couple the fan partition 428 to the bracket 416. The connectors 433 may be snap fit connectors similar to bracket connectors 426. The connector 433-1 is positioned to engage rail 432, while the connector 433-2 is positioned to engage rail 433. A baffle 432 may be connected to, and extend from, connectors 433. In this example, the baffle 432 has a generally sheet or plate like shape which is relatively thin in one dimension and relatively broad in dimensions d and h, which are perpendicular to the thin dimension. When mounted to the bracket 416, both dimensions d and h of the fan partition 428 are perpendicular to the length L of the bracket 416. When installed in a computing system, dimensions d and h of the fan partition 428 may be parallel to the front-to-back dimension D and the height dimension H of the system, respectively (see FIG. 10 for one example of these system dimensions). In some examples, the baffle 432 may be substantially solid; however, in other examples, baffle 432 may also contain perforations or cutouts.

Figure 10:
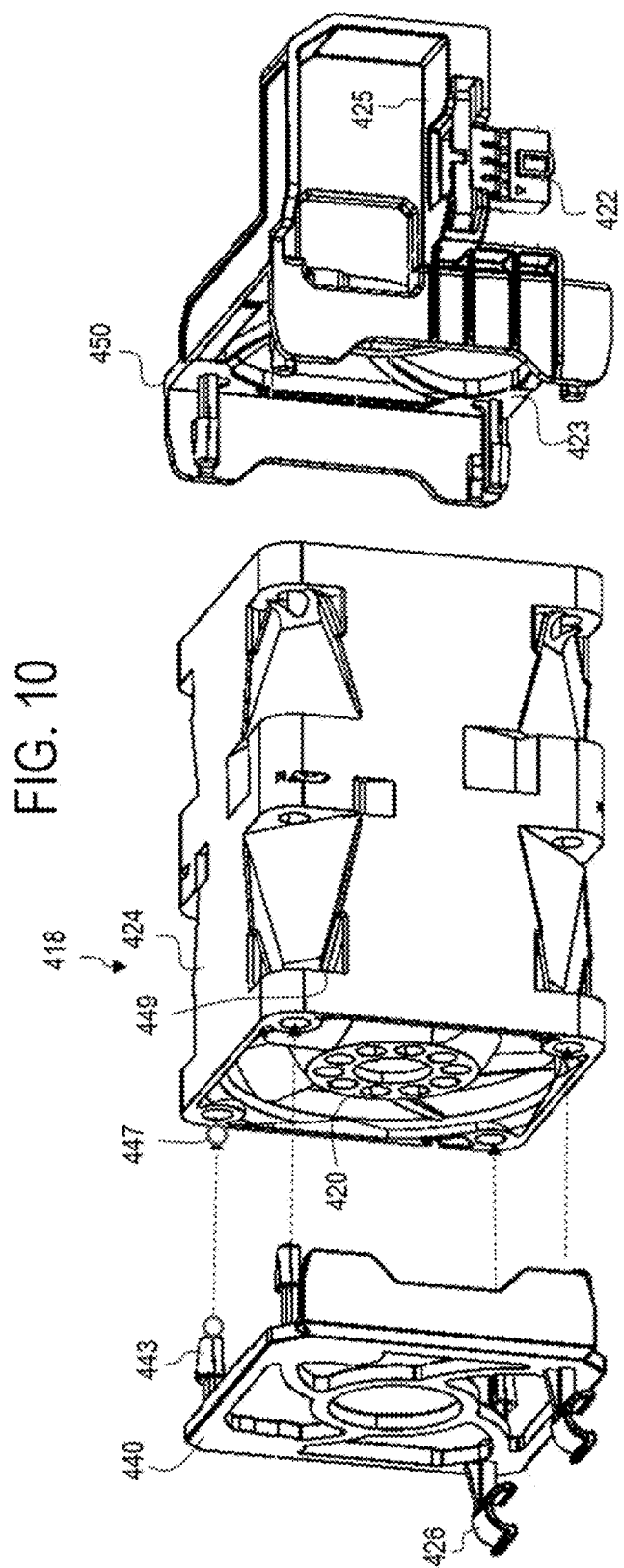
FIG. 10 is an exploded perspective view of a fan module comprising the fan grating of the fan mounting system of FIG. 4.

Turning now to FIG. 10, a fan module 418 configured to be used with the fan mounting system 430 will be described. The fan module 418 comprises a fan housing 424, which houses a fan rotor 420 and a fan motor (not illustrated). In addition, the fan module 418 comprises the fan grating 440 described above, which is attached to a first face of the fan housing 424 via attachment elements 443 and 446 engaging complementary attachment elements 447 and 449, respectively. The bracket connectors 426 are also indirectly attached to the fan module 418 by virtue of the connectors 426 being integrally formed with the frame 441 which is attached to the fan module 418. The fan module 418 also comprises a connector/grating assembly 450. The connector/grating assembly 450 comprises fan grating portion 423 which comprises a frame, protective members, and attachment members similar to those of fan grating 440, as well as a connector support portion 425 which is attached to and protrudes from the fan grating portion 423. The connector support portion 425 is connected to and supports the electrical connector 422 of the fan module 418. The electrical connector 418 may be electrically connected to the fan motor and/or other electronics of the fan module 418 when the connector/grating assembly 450 is installed on the fan housing 424 by electrical connections not illustrated in the figures, such as a cable or an electrical interface (e.g., pins, contact pads, etc.) between the fan housing 424 and connector/grating assembly 450.

Figure 11:
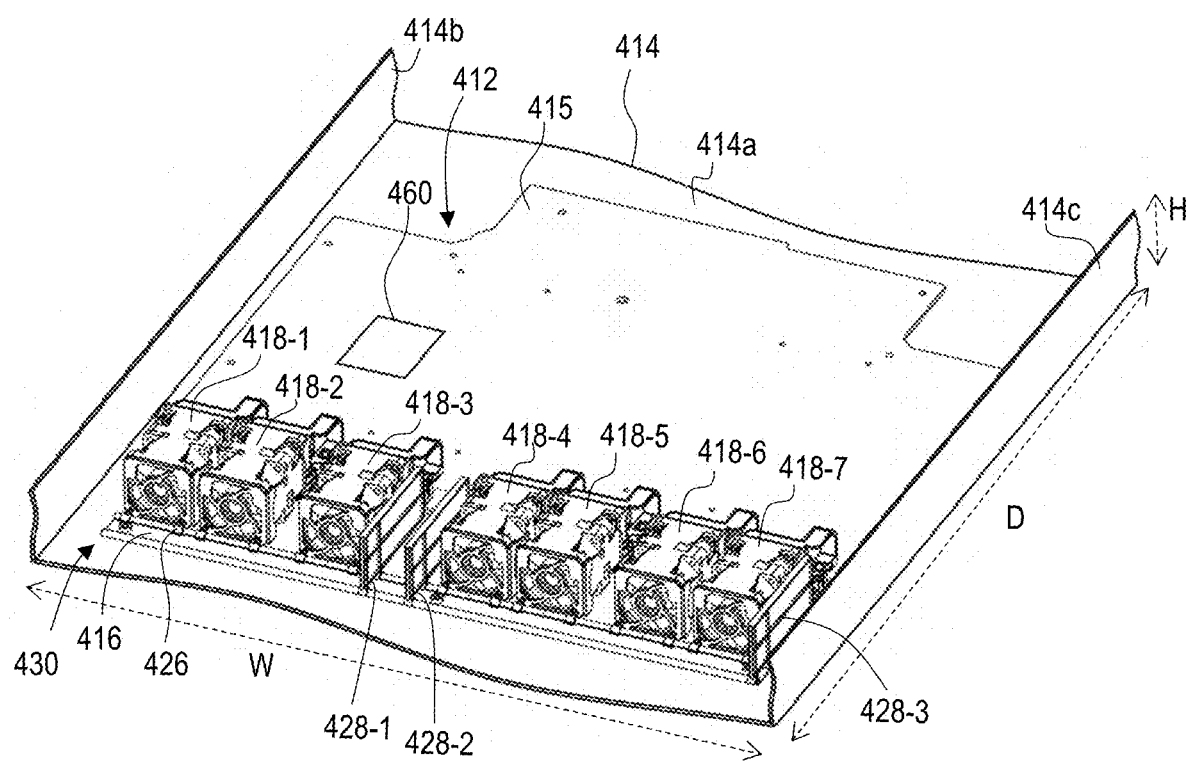
FIG. 11 is a perspective view of an example computing system comprising the fan mounting system of FIG. 4.
Figure 12:
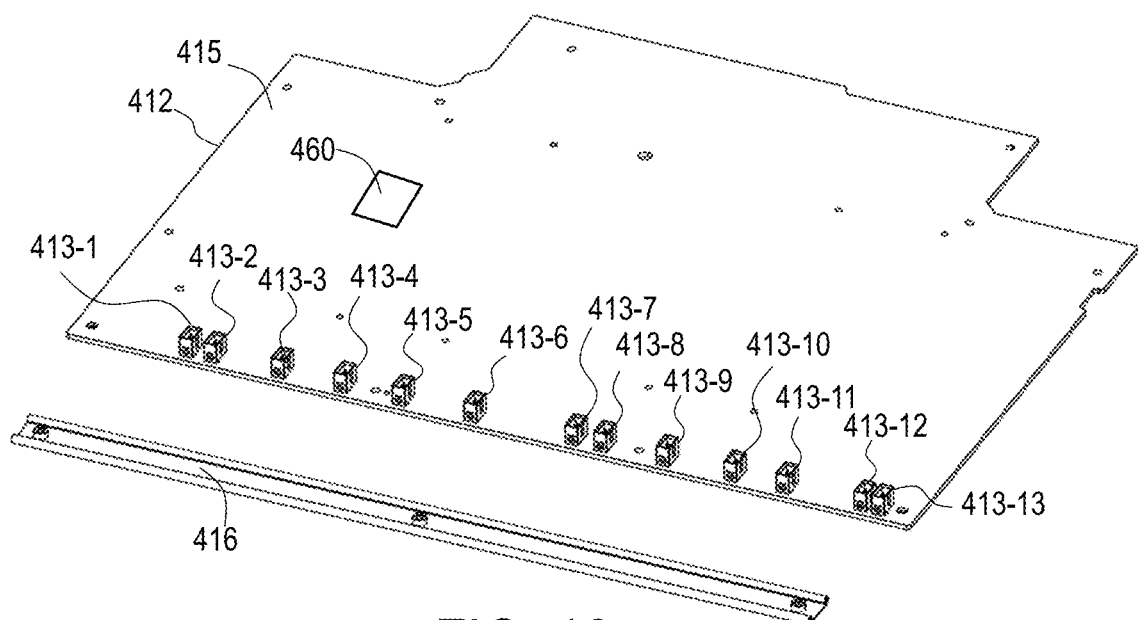
FIG. 12 is a perspective view of an example computing system of FIG. 11 in a state of one of the fans installed and with the chassis omitted from the view.
Figure 13:
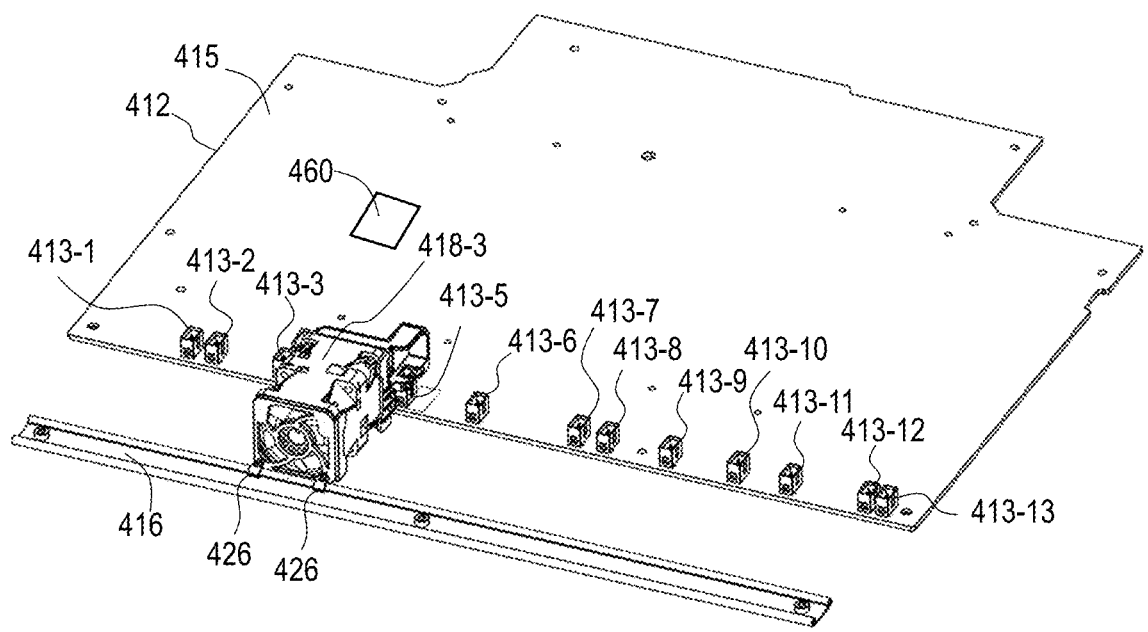
FIG. 13 is another perspective view of the computing system of FIG. 11 in a state of one of the fans installed and with the chassis omitted from the view.
Figure 14:
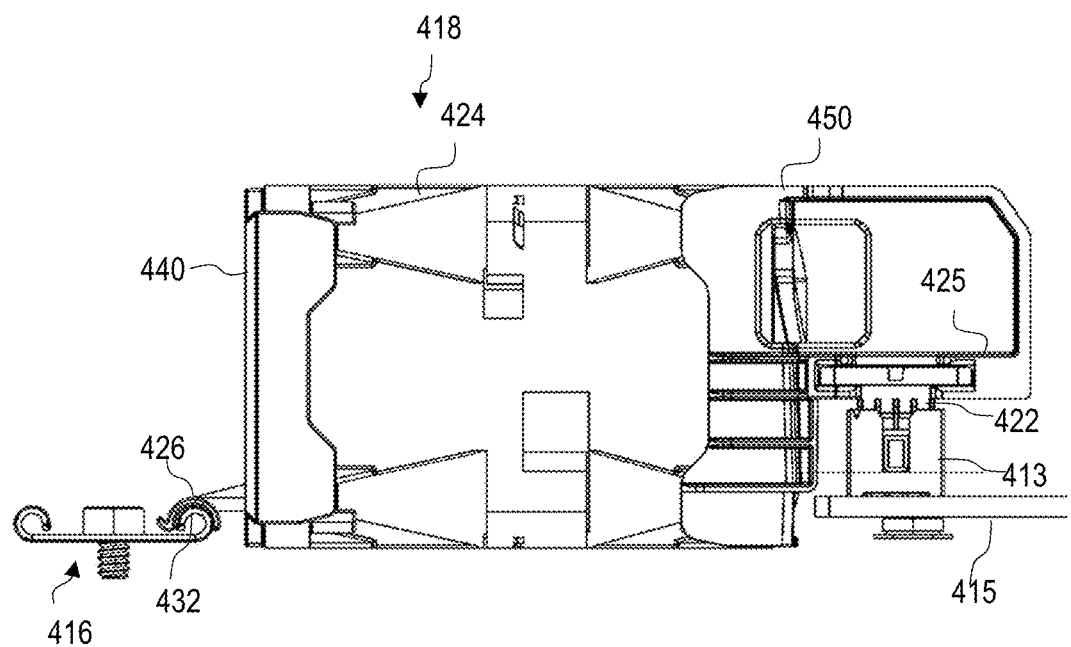
FIG. 14 is a side view of the computing system of FIG. 13 in a state of one of the fans installed and with a chassis omitted from the view.

Turning now to FIGS. 11-14, the computing system 410 comprising the fan mounting system 430 will be described. As shown in FIG. 11, the computing system 10 comprises a chassis 414, a PCA 412, the fan mounting system 430, and a plurality of fan modules 418 secured to the chassis 414 by the fan mounting system 430. The computing system 410 may also comprise additional components familiar to those of ordinary skill in the art, which are omitted from the drawings, such as storage drives, power supply units, expansion cards, etc. FIG. 11 illustrates the system 410 with mounting system 430 and fan modules 418 in an installed state. FIG. 12 illustrates the system 410 in a state with fan modules 418 and partitions 428 not installed. FIG. 13 illustrates the system 410 in a state with one fan module 418 installed. FIG. 14 comprises an enlarged view illustrating a portion of the system 410 in a state with one fan module 418 installed.

As shown in FIG. 11, in this example, the chassis 414 comprises a base pan 414a extending along width dimension W and front-to-back dimension D. In this example, chassis 414 also comprises to side walls 414*b* and 414*c* coupled to the bae pan 414*a* and extending along front-to-back dimension D and height dimension H. The chassis 414 may also comprise a cover/lid (not illustrated) and front and back panels (not illustrated).

The PCA 412 comprises a PCB 415, one or more electronic components 460 (such as a processor) mounted to the PCB 415, and a plurality of fan connectors 413 mounted to the PCB 415. As shown in FIG. 11, the PCA is mounted to the base pan 414*a*, with PCB 415 and base pan 414*a* parallel to one another. As shown in FIG. 12, in this example, the PCA 412 comprises thirteen fan connectors 413-1 to 413-13, which are arranged along a line parallel to the width dimension W. Other examples may have more or fewer fan connectors 413.

As shown in FIG. 11, the bracket 416 of the fan mounting system 430 is attached to the base pan 414*a*. In this example, mechanical fasteners 434 are used to attach bracket 416 to the chassis 414. As shown in FIGS. 11 and 14, a first side of each fan module 418 is secured to the chassis 414 by way of coupling the connectors 426 attached to the respective fan module 418 to the bracket 416. A second side of each fan module 418 is secured to the PCA 412 by way of coupling the electrical connector 422 of the respective fan module 418 with one of the fan connectors 413 of the PCA 12. In this way, each fan module 418 is secured relative to the chassis 414 in part by mounting through the fan mounting system 430 and in part by connection to the PCA 412.

Returning to FIG. 11, in this example, the fan mounting system 430 comprises multiple fan partitions 428. Fan partitions 428-1 and 428-2 are positioned between two adjacent fan modules 418-3 and 418-4, thus forming a corridor therebetween through which cables or other components can be routed. In this example, another fan partition 428-3 is positioned between fan 418-7 and lateral wall 414*c*, defining another corridor therebetween. The fan partitions 428 may protect the fan modules 418 from the cables or other components routed through the corridors so that the cables or other components do not push against or contact the fan modules 418, which could cause damage to or move the fan modules 418. The particular number and positions of fan partitions 428 illustrated in FIG. 11 is one example only. Fewer or more fan partitions 428 could be included in other examples, and the fan partitions 428 could be positioned anywhere along the bracket 416 that is desired, as long as the space is not already occupied (e.g., fan partitions could be positioned between fans 418-5 and 418-6, between fans 418-2 and 418-3, between fan 418-1 and wall 414*b*, etc.).

As can be seen by comparing FIGS. 11 and 12, in some examples there may be more fan connectors 413 than there are fan modules 418. This may allow for different fan arrangements to be used with the same PCA 412. For example, in the arrangement of FIG. 11, fans 418-1 to 418-7 are connected to fan connectors 413-1, 413-3, 413-5, 413-7, 413-9, and 413-13, respectively, but in another arrangement using the same PCA 412, fans 418-1 to 418-6 may be connected to fan connectors 413-2, 413-4, 413-6, 413-8, 413-10, and 413-12, respectively. These are two examples only, and additional fan arrangements could also be provided by using different combinations of the fan connectors 413. This ability to position the fans differently by connecting different fan connectors 413 can allow flexibility in how a given system is configured without necessarily needing to change out the PCA for each different configuration. This can also allow for greater modularity in manufacturing as the same general PCA design may be shared among multiple different models or configurations of the system, which can save manufacturing costs. Moreover, because the bracket 416 allows for the connectors 426 to be connected at any of an infinite set of locations along its length, the aforementioned different fan arrangements can all be accommodated by the same single bracket design. This further supports greater modularity by allowing the same bracket to be used with each of the various models or configurations noted above. Furthermore, not only can the arrangement of fan locations be varied on a given PCA, fan locations can also be varied from one model or configuration to another by changing out the PCA for a different PCA having a different arrangement of fan connectors. In such a case, the same bracket 416 could also be used with those systems having the different PCAs because the connection locations for the bracket connectors 426 to connect to the bracket 41 are not limited to a finite set of predetermined locations.

Figure 15:
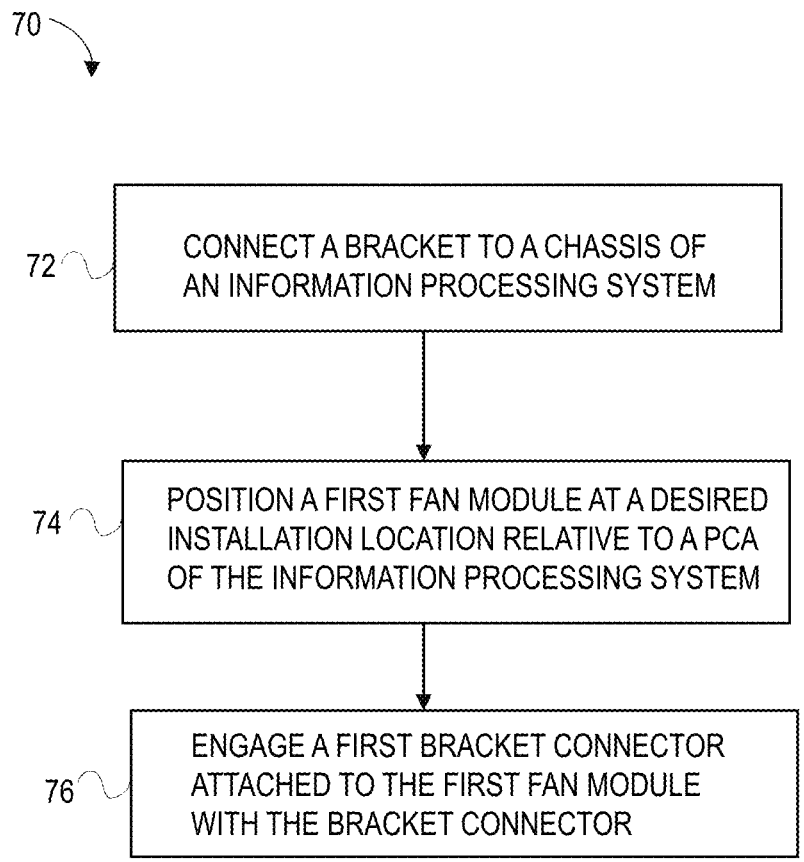
FIG. 15 is a process flow chart depicting an example method for using a fan mounting system consistent with the present disclosure.

FIG. 15 is an example method 70 for installing fans in an information processing system consistent with the present disclosure. At 72, method 70 includes connecting a bracket to a chassis of the information processing device. The bracket may be any of the brackets described herein, such as brackets 16 and 416 described above. The bracket may be connected to the chassis such that a length dimension of the bracket is parallel to a width dimension of the chassis.

At 74, method 70 includes positioning a first fan module at a desired installation location relative to a PCA of the information processing system. Positioning the first fan module may include positioning the first fan module such that a fan connector on the PCA is aligned with an electrical connector of the first fan module. The PCA 12 may be contained within or be part of the information processing system and may be supported by the chassis.

At 76, method 70 includes engaging a first bracket connector attached to the first fan module with the bracket. The first fan module will then be coupled to the bracket, which is in turn attached to the chassis. Thus, stated another way, method 70 may comprise attaching the fan to the chassis by engaging the first bracket connector to the bracket. In addition, prior to, concurrently with, or subsequent to engaging the first bracket connector with the bracket, a first electrical connector of the fan module may be engaged with a first fan connector located on the PCA. The first bracket connector may be any one of the bracket connectors described herein, such as bracket connectors 26 and 426. As described, the first bracket connector is couplable to the bracket at any coupling location along the length dimension of the bracket. The coupling locations of bracket may be infinite; that is, any location along at least a given length of the bracket may be able to receive the first bracket connector. In some examples, the allowed installation locations for the fans is constrained primarily by the locations of the connectors on the PCA, with the bracket not limiting the particular locations of the fans along the length thereof.

Method 70 may further include positioning a second fan module at a second desired installation location. As with the first fan module, the second fan module is positioned such that a second electrical connector is aligned with a second fan connector on the PCA. Once the second fan module is positioned and aligned, a second bracket connector located on second fan module may be engaged with bracket to couple the second fan module with the bracket. In addition, the second electrical connector may be coupled with the second fan connector so that second fan module is fully connected to and coupled with the information processing system.

A fan partition may further be positioned along the bracket. The fan partition may include a connector and a baffle. The fan partition may be any of the fan partitions described herein, such as fan partition 28 or 428 described above. The fan partition may be engaged with the bracket by the connector such that the baffle extends upwardly from the connector and thus from the bracket. In some examples, the fan partition may be positioned between the first fan module and the second fan module. In such examples, the baffle of the fan partition may separate the first fan module from the second fan module when the fan partition is coupled to the bracket.

It is to be understood that both the general description and the detailed description provide example implementations that are explanatory in nature and are intended to provide an understanding of the present disclosure without limiting the scope of the present disclosure. Other examples in accordance with the present disclosure will be apparent to those skilled in the art based on consideration of the disclosure herein. For example, various mechanical, compositional, structural, electronic, and operational changes may be made to the disclosed examples without departing from the scope of this disclosure, including for example the addition, removal, alteration, substitution, or rearrangement of elements of the disclosed examples, as would be apparent to one skilled in the art in consideration of the present disclosure. Moreover, it will be apparent to those skilled in the art that certain features or aspects of the present teachings may be utilized independently (even if they are disclosed together in some examples) or may be utilized together (even if disclosed in separate examples), whenever practical. In some instances, well-known circuits, structures, and techniques have not been shown or described in detail in order not to obscure the examples. Thus, the following claims are intended to be given their fullest breadth, including equivalents, under the applicable law, without being limited to the examples disclosed herein.

References herein to examples, implementations, or other similar references should be understood as referring to prophetic or hypothetical examples, rather than to devices/systems that have been actually produced, unless explicitly indicated otherwise. Similarly, references to qualities or characteristics of examples should be understood as representing the educated estimates or expectations of the inventors based on their understanding of the relevant principles involved, application of theory and/or modeling, and/or past experiences, rather than as being representations of the actual qualities or characteristics of an actually produced device/system or the empirical results of tests actually carried out, unless explicitly indicated otherwise.

Further, spatial, positional, and relational terminology used herein is chosen to aid the reader in understanding examples of the invention but is not intended to limit the invention to a particular reference frame, orientation, or positional relationship. For example, spatial, positional, and relational terms such as "up", "down", "lateral", "beneath", "below", "lower", "above", "upper", "proximal", "distal", and the like may be used herein to describe directions or to describe one element's or feature's spatial relationship to another element or feature as illustrated in the figures. These spatial terms are used relative to reference frames in the figures and are not limited to a particular reference frame in the real world. Furthermore, if a different reference frame is considered than the one illustrated in the figures, then the spatial terms used herein may need to be interpreted differently in that different reference frame. Moreover, the poses of items illustrated in the figure are chosen for convenience of illustration and description, but in an implementation in practice the items may be posed differently.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition. Moreover, unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

What is claimed is:

1. An information processing system, comprising:
   a printed circuit board assembly comprising a plurality of fan connectors;
   a chassis configured to receive and support the printed circuit board assembly;
   a bracket configured to be coupled with the chassis such that a length dimension of the bracket extends along a width dimension of the chassis; and
   a fan module, wherein the fan module comprises:
      a fan rotor;
      an electrical connector configured to be electrically coupled with a fan connector of the plurality of fan connectors;
      a fan housing containing the fan rotor; and
      a bracket connector integrally coupled to the fan housing and configured to removably couple the fan module to the bracket at any location out of an infinite set of connection locations along the length dimension of the bracket.

2. The system of claim 1, further comprising a fan partition, wherein the fan partition further comprises:
   a second bracket connector to removably couple the fan partition to the bracket; and
   a baffle extending from the second bracket connector.

3. The system of claim 1, wherein the bracket connector is a snap fit connector.

4. The system of claim 3, wherein the bracket connector couples to an edge portion of the bracket.

5. The system of claim 1, wherein the bracket includes a rolled edge to receive the bracket connector.

6. The system of claim 1, wherein the fan module, upon being connected to the bracket, is positioned such that the electrical connector of the fan module is aligned with a fan connector of the plurality of fan connectors.

7. The system of claim 1, wherein, in a state of the printed circuit board assembly mounted to the chassis, the plurality of fan connectors is arranged along a line parallel to the length dimension of the bracket and the width dimension of the chassis.

8. The information processing system of claim 1, wherein:
the printed circuit board assembly is mounted to the chassis, the bracket is coupled with the chassis, the fan module is a first fan module, the electrical connector is a first electrical conductor electrically coupled with a first fan connector of the plurality of fan connectors, and the bracket connector is a first bracket connector coupling the first fan module to the bracket at a first location; and
wherein the system further comprises:
a second fan module, wherein the second fan module further comprises:
a second rotor;
a second electrical connector configured to be electrically coupled with a second fan connector of the plurality of fan connectors;
a second fan housing containing the second fan rotor; and
a second bracket connector to removably couple the second fan module to the bracket at a second location; and
a fan partition, wherein the fan partition further comprises:
a connector to removably couple the fan partition to the bracket at a third location; and
a baffle extending upward from the connector.

9. The information processing system of claim 8, wherein the first and second fan modules are movable between the plurality of fan connectors.

10. A fan mounting system, comprising:
a bracket configured to be removably coupled to a chassis such that a length dimension of the bracket extends along a width dimension of the chassis;
a bracket connector integrally coupled or configured to be integrally coupled to a fan housing of a fan module and configured to be removably coupled with the bracket, at any location out of an infinite set of connection locations along the length dimension of the bracket to mount the fan module to the chassis.

11. The fan mounting system of claim 10, further comprising a fan partition, wherein the fan partition further comprises:
a baffle; and
a connector formed at a lower portion of the baffle, wherein the connector is configured to be removably coupled with the bracket at any location out of the infinite set of connection locations.

12. The fan mounting system of claim 10, wherein:
the bracket connector is integrally connected to a fan grating of the fan module; and
the fan grating is configured to be attached to a fan housing of the fan module.

13. The fan mounting system of claim 12, further comprising a second bracket connector integrally connected to the fan grating and configured to be removably coupled with the bracket at any location out of an infinite set of connection locations.

14. The fan connection system of claim 10, wherein the bracket includes a rolled edge to receive the bracket connector.

15. The fan connection system of claim 10, wherein the bracket connector is a snap fit connector.

16. The fan connection system of claim 10, comprising a plurality of bracket connectors including the bracket connectors, wherein the plurality of bracket connectors is attached to, or configured to be attached to, the fan module.

* * * * *